(12) United States Patent
Fukushima et al.

(10) Patent No.: US 7,825,579 B2
(45) Date of Patent: Nov. 2, 2010

(54) DISPLAY DEVICE

(75) Inventors: Kazuo Fukushima, Niigata (JP); Raiei Cho, Niigata (JP); Hideki Ikarashi, Niigata (JP); Naoji Shoji, Niigata (JP)

(73) Assignee: Nippon Seiki Co., Ltd., Niigata (JP)

( * ) Notice: Subject to any disclaimer, the term of this patent is extended or adjusted under 35 U.S.C. 154(b) by 279 days.

(21) Appl. No.: 11/795,645

(22) PCT Filed: Dec. 20, 2005

(86) PCT No.: PCT/JP2005/023301

§ 371 (c)(1),
(2), (4) Date: Jul. 19, 2007

(87) PCT Pub. No.: WO2006/080163

PCT Pub. Date: Aug. 3, 2006

(65) Prior Publication Data

US 2008/0158852 A1    Jul. 3, 2008

(30) Foreign Application Priority Data

Jan. 31, 2005    (JP)    ............... 2005-023682

(51) Int. Cl.
*H01J 1/62*    (2006.01)
(52) U.S. Cl. ............... 313/503; 362/29; 362/489
(58) Field of Classification Search .............. 313/503; 362/29, 489
See application file for complete search history.

(56) References Cited

U.S. PATENT DOCUMENTS 4,431,966 A * 2/1984 Pucciarello ............ 362/29
5,971,558 A * 10/1999 Peel ..................... 362/26
2002/0093284 A1* 7/2002 Adachi et al. ........... 313/506

FOREIGN PATENT DOCUMENTS

| JP | 5-204320 | 8/1993 |
|---|---|---|
| JP | 9-127885 | 5/1997 |
| JP | 2002-132187 | 5/2002 |
| JP | 2003-257660 | 9/2003 |
| JP | 2004-53639 | 2/2004 |
| JP | 2004-207094 | 7/2004 |
| JP | 2004-258255 | 9/2004 |

* cited by examiner

*Primary Examiner*—Peter Macchiarolo
(74) *Attorney, Agent, or Firm*—McDermott Will & Emery LLP

(57) ABSTRACT

A display device is provided with a light emitting display element that presents an impression that the light emitting display element and the periphery thereof are integrated, while suppressing reflection due to outside light. The display device is provided with an electroluminescence display element having a glass substrate (light transmitting substrate), a transparent electrode, a light emitting layer and a back plate; a light transmitting member arranged on a front side of the electroluminescence display element; a circularly polarizing plate arranged on the front side of the light transmitting member; a black light blocking layer arranged on a back side of the light transmitting member for covering an area other than a display area "S" of the electroluminescence display element; and a reflection layer having the same or similar color tone as the back plate.

4 Claims, 4 Drawing Sheets

DISPLAY DEVICE

This application is the U.S. National Phase under 35 U.S.C. §371 of International Application No. PCT/JP2005/023301, filed on Dec. 20, 2005, which in turn claims the benefit of Japanese Application No. 2005-023682, filed on Jan. 31, 2005, the disclosures of which Applications are incorporated by reference herein.

TECHNICAL FIELD

The present invention relates to a display device having a self light emitting type display element such as an electric field light emitting display element, etc.

BACKGROUND ART

For example, patent document 1 and patent document 2 describe a display device having an electric field light emitting display element. In the display device described in patent document 1, for example, as shown in FIG. 1 of patent document 1, a rear face electrode 29 constituting an electric field light emitting display element 20 is approximately arranged on the entire face of a glass substrate 25. Thus, even when external light such as sun light, etc., is incident, about the entire range of the electric field light emitting display element 20 is approximately seen in a uniform color tone and there is no fear that the outward appearance is worsened.

Further, in the display element described in patent document 2, for example, as shown in FIG. 2 of patent document 2, circularly polarized light means 49 constructed by a linearly polarized light plate 11 and a birefringent plate 23 is stuck to a face of a substrate 6 of an organic EL element 40 (electric field light emitting display element). Thus, it is restrained that reflected light incident from the exterior and reflected within the organic EL element 40 is emitted on an incident side. Further, a contrast ratio with respect to a display image of the organic EL element 40 is improved.

Patent document 1: JP-A-2002-132187

Patent document 2: JP-A-9-127885

However, in the display device described in the above patent document 1, about the entire range of only the electric field light emitting display element 20 is approximately seen in a uniform color tone, but a display plate 12 having a window portion 21 on a forward side of the electric field light emitting display element 20 is arranged as shown in its FIG. 1 of patent document 1. Therefore, an end face (cut end) of the window portion 21 is seen and color tones of a light interrupting layer 12b arranged on a front face side of the display plate 12 and the electric field light emitting display element 20 are different so that there is a feeling of physical disorder. A similar phenomenon is also seen in FIG. 8 of patent document 1.

Further, in a character plate 39 shown in FIG. 7 of patent document 1, no hole (window portion) is arranged but its portion is set to a transmitting portion 40 instead of this hole. Accordingly, an end face (cut end) caused by arranging the hole is not seen, but the color tones and gloss states of the electric field light emitting display element 20 visualized by transmitting the transmitting portion 40 and its circumferential light interrupting layer 39b (black color) are different. Further, partition (boundary) with respect to the electric field light emitting display element 20 is clear, and the impression that the electric field light emitting display element 20 is a separate object (separate display) is really given although it is also similar in FIG. 1, of patent document 1.

Further, in patent document 2, visibility in a simplex state of the organic EL element 40 is greatly improved. However, for example, when such a display element is used in the display device shown in FIG. 7 of patent document 1, there is also external light particularly reflected on the transmitting portion 40. An effect as the circularly polarized light means 49 is faded.

DISCLOSURE OF THE INVENTION

Problems that the Invention is to Solve

The present invention is made in consideration of such points, and its object is to provide a display device in which the light emitting display element and its circumference have an oneness appearance while reflection due to external light is restrained in the display device having the light emitting display element.

Means for Solving the Problems

To achieve the above object, the present invention resides in a display device comprising a light emitting display element; a translucent member arranged on a front face side of this light emitting display element; a circularly polarized light plate arranged on a front face side of this translucent member; and a light interrupting layer arranged on a rear face side of this circularly polarized light plate or arranged in the translucent member, and covering a portion except for a display area of the light emitting display element.

Further, the light emitting display element is constructed by an electric field light emitting display element having a translucent substrate, a transparent electrode, a light emitting layer and a rear face electrode; and a reflecting layer having the same color as a color tone of the rear face electrode or a color approximate to this color is arranged between the circularly polarized light plate and the light interrupting layer.

Further, the translucent member is constructed by a material having an approximately isotropic refractive index.

Further, the present invention resides in a display device comprising a light emitting display element; a display plate arranged on a front face side of this light emitting display element; and a circularly polarized light plate arranged on a front face side of this display plate; wherein the display plate has a first display area for arranging a display portion of a light transmitting property and a ground portion that is not light transmittable in a substrate of a light transmitting property, and a second display area not where the display portion and the ground portion are arranged correspondingly to the light emitting display element.

Further, the light emitting display element is constructed by an electric field light emitting display element having a translucent substrate, a transparent electrode, a light emitting layer and a rear face electrode; and a reflecting layer having the same color as a color tone of the rear face electrode or a color approximate to this color is arranged between the circularly polarized light plate and the ground portion.

Further, a visible display portion is arranged in a front face side portion of the circularly polarized light plate corresponding to the display portion.

Further, the substrate is constructed by a material having an approximately isotropic refractive index.

Effect of the Invention

It is possible to obtain a display device in which the light emitting display element and its circumference have an oneness appearance while reflection due to external light is restrained in the display device having the light emitting display element.

Figure 1:
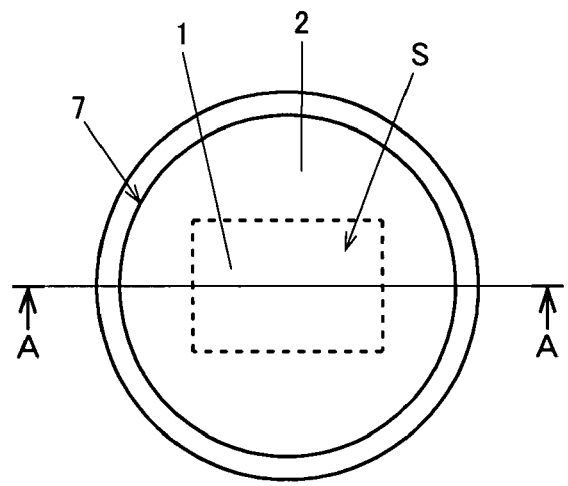
FIG. 1 is a front view of a display device showing a first embodiment mode of the present invention.

DESCRIPTION OF THE REFERENCE NUMERALS AND SIGNS 1 electric field light emitting display element
2 translucent member
3 circularly polarized light plate
15 rear face electrode
18 reflecting layer
19 light interrupting layer
22 display portion
23 display plate

BEST MODE FOR CARRYING OUT THE INVENTION

Figure 2:
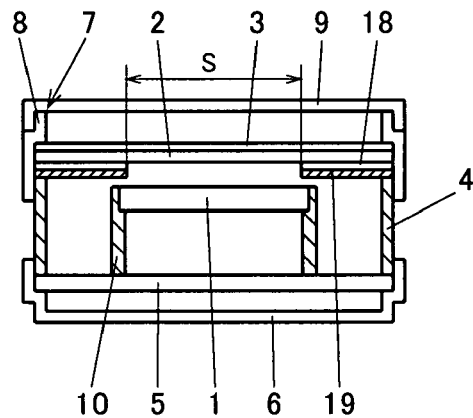
FIG. 2 is a cross-sectional view of this display device (section A-A in FIG. 1).
Figure 3:
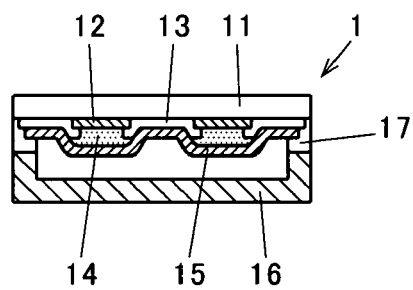
FIG. 3 is a cross-sectional view of an electric field light emitting display element used in this display device.

The present invention will be explained on the basis of each embodiment mode. FIGS. 1 to 3 show a first embodiment mode of the present invention. FIG. 1 is a front view of a display device having an electric field light emitting display element 1. FIG. 2 is its cross-sectional view (section A-A in FIG. 1). FIG. 3 is a cross-sectional view showing details of the electric field light emitting display element 1.

The display device in this embodiment mode has the electric field light emitting display element 1, a translucent member 2 arranged on a front face side of the electric field light emitting display element 1, and a circularly polarized light plate 3 arranged on a front face side of the translucent member 2. The display device also has a case member 4 for holding the translucent member 2 and manufactured with synthetic resin, a hard circuit substrate 5 electrically connected to the electric field light emitting display element 1 and mounting a driving circuit, etc. for operating the electric field light emitting display element 1, and a cover 6 for covering a rear face side of the circuit substrate 5. The display device further has a looking-back member 8 arranged on a circumferential edge forward side of the circularly polarized light plate 3. The looking-back member 8 is a cylindrical-shaped visor which has an opening portion 7 for determining a visible area of the circularly polarized light plate 3 (translucent member 2) and is constructed with e.g., black synthetic resin, and a seeing-through plate 9 for covering the forward side of the circularly polarized light plate 3 and is constructed with colorless transparent synthetic resin. The electric field light emitting display element 1 is held in a holder 10 arranged in the case member 4.

For example, the electric field light emitting display element 1 has a display segment of a squarish eight shape, such that the display segment has seven sides arranged in the shape of the numeral "8" and the display segment is displayed as a display portion by emitting light from an organic layer. For example, when the display device is arranged in a vehicle, a running distance of the vehicle, outside air temperature, etc. are displayed. FIG. 3 shows a section of the electric field light emitting display element 1. In the electric field light emitting display element 1, a transparent electrode 12 consists of ITO, an insulating layer 13, an organic layer 14, and a rear face electrode 15 constructed with aluminum, etc. are sequentially laminated on the back face of a glass substrate 11 as a translucent substrate. A seal glass 16 is arranged in a backward direction of the rear face electrode 15. The seal glass 16 is fixedly attached to the glass substrate 11 by an adhesive 17. The organic layer 14 emits light by applying a voltage to the transparent electrode 12 and the rear face electrode 15.

It is sufficient for the organic layer 14 to have at least a light emitting layer, but the organic layer 14 may also have a positive hole injecting layer, a positive hole transport layer and an electronic transport layer. Further, it is sufficient for the rear face electrode 15 to be formed in a place corresponding to at least the display segment. However, the glass substrate 11, the transparent electrode 12, the insulating layer 13 and the organic layer 14 are approximately transparent. □@□@ In contrast to this, the rear face electrode 15 is constructed with a metal such as aluminum, etc. and is seen so as to approximately become a mirror face. Therefore, the rear face electrode 15 is not formed in one portion of the glass substrate 11, but is approximately formed in its entire range, and is set so as to approximately uniformly see an entire face of the electric field light emitting display element 1.

For example, the translucent member 2 is constructed by colorless transparent acrylic resin, polycarbonate resin, etc. constructed by a material having an approximately isotropic refractive index. A reflecting layer 18 of silver color or gray color, etc. (when the rear face electrode 15 is constructed with aluminum) as the same color as a color tone of the above rear face electrode 15 or a color approximate to this color, and a black light interrupting layer 19 are arranged on the rear face side of the translucent member 2. This reflecting layer 18 and the light interrupting layer 19 determine a display area S of the electric field light emitting display element 1, and are arranged in a place of the translucent member 2 except for an area constituting the display area S. Namely, only the display area S is set to be able to be perspective (in a state in which no circularly polarized light plate 3 is arranged), and the display area S is narrower than the range of the rear face electrode 15 formed in the electric field light emitting display element 1. In FIG. 1, the interior of a rectangular broken line is the display area S.

The translucent member 2 is set to a colorless transparent material, but may be also colored if the translucent member 2 has a light transmitting property. Further, the light interrupting layer 19 and the reflecting layer 18 may be also arranged on the rear face side of the circularly polarized light plate 3 or the front face side of the translucent member 2. In this case, the light interrupting layer 19 is arranged on the electric field light emitting display element 1 side from the reflecting layer 18. The reflecting layer 18 may be arranged on the rear face side of the circularly polarized light plate 3, and the light interrupting layer 19 may be also arranged on the translucent member 2.

As described in the above patent document 2, the circularly polarized light plate 3 is formed by laminating the linearly polarized light plate and the birefringent plate. Light incident from the birefringent plate side passes the linearly polarized light plate. However, it is restrained that light incident from the linearly polarized light plate side and passing the birefringent plate and reflected on the birefringent plate side is returned to the incident side (reflected light is restrained). In this circularly polarized light plate 3, the birefringent plate is stuck to the front face side of the translucent member 2 such that the birefringent plate locates on the electric field light emitting display element 1 side.

In the display device constructed in this way, the circularly polarized light plate 3 is arranged on the front face side of the translucent member 2 at a non-display time. Therefore, even when external light is incident into the circularly polarized light plate 3 and is reflected within the translucent member 2 and the electric field light emitting display element 1 as mentioned above, its reflected light is restrained. Thus, the entire face (visible area of the display device) within the opening portion 7 of the looking-back member 8 is uniformly visualized so as to be blackish as well as the display area S of the electric field light emitting display element 1. When a voltage is applied to the electric field light emitting display element 1, the organic layer 14 emits light and a display portion is uniformly transmission-displayed on the blackish face. Further, when the translucent member 2 is a material of a high birefringent property, the reflected light is easily transmitted through the circularly polarized light plate 3 and an effect as the circularly polarized light plate 3 tends to be thinned. However, since the translucent member 2 is constructed with a material having an approximately isotropic refractive index, the reflected light is restrained in the circularly polarized light plate 3.

When strong external light is incident to the visible area of the display device and it is seen from a slanting direction, there is a case in which the translucent member 2 and the electric field light emitting display element 1 are slightly visualized. Namely, the reflected light is slightly emitted. However, the rear face electrode 15 of the electric field light emitting display element 1 is approximately formed on the entire face of the glass substrate 11, and the reflecting layer 18 having the same color as the color tone of the rear face electrode 15 or a color approximate to this color is arranged in the translucent member 2. Therefore, even when it is seen from the slanting direction, the entire face is visualized in a uniform color tone. A reflecting layer 18 may not be require to arrange if there is no bad affect on visibility.

Thus, a boundary (or step difference feeling), a difference of a color tone, etc. between the electric field light emitting display element 1 and its circumference are removed irrespective of a display time and a non-display time, and a display device having an oneness appearance can be obtained. Accordingly, even when large-sized electric field light emitting display element corresponding to the visible area of the display device is not used, the display device having an oneness appearance can be obtained and an increase in cost is also restrained.

The light interrupting layer 19 also has a role for preventing that display light (emitted light) from the electric field light emitting display element 1 is reflected on the reflecting layer 18 and illuminates the glass substrate face 11 of the electric field light emitting display element 1. Accordingly, the light interrupting layer 19 is not limited to black color, but is desirably set to a dark color system such as thick gray, thick blue, thick green, etc. Further, the electric field light emitting display element 1 is used as the light emitting display element, but a self light emitting type display element such as a fluorescent display tube, an inorganic EL element, a light emitting diode display element, etc. may be also applied.

Figure 4:
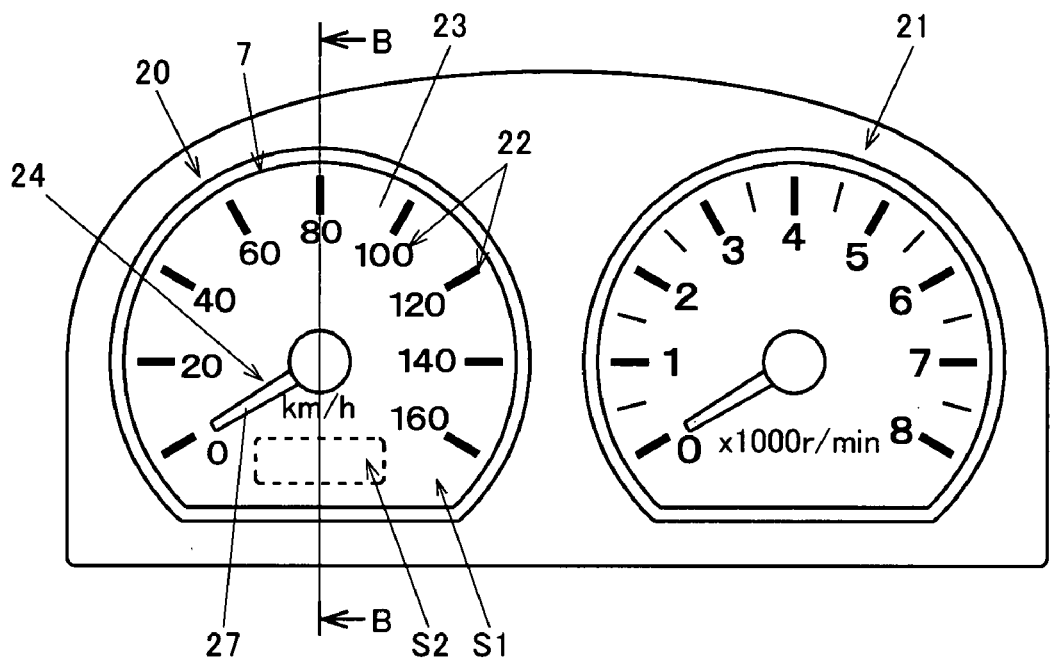
FIG. 4 is a front view of a display device showing a second embodiment mode of the present invention.
Figure 5:
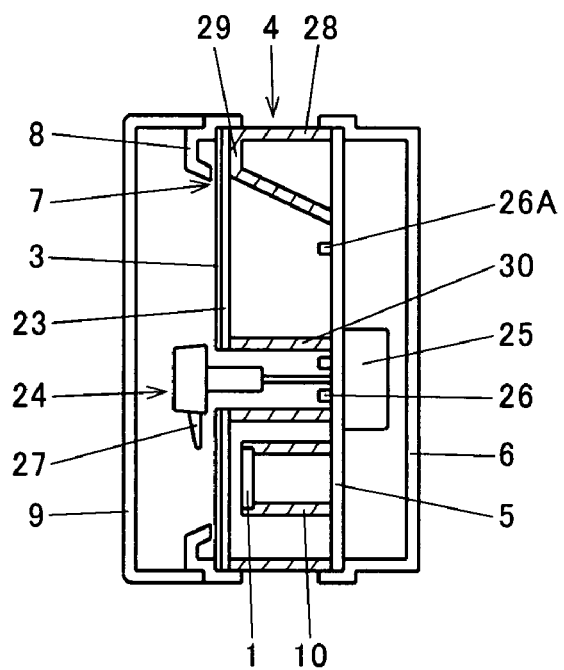
FIG. 5 is a cross-sectional view of this display device (section B-B in FIG. 4).
Figure 6:
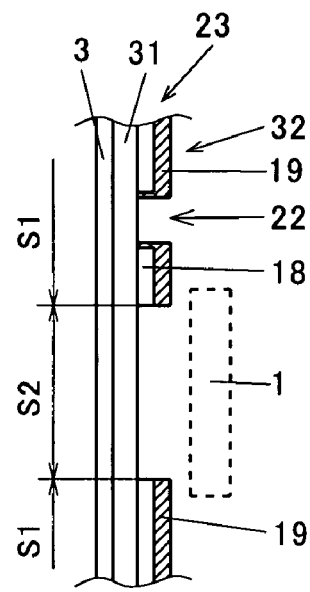
FIG. 6 is a partial sectional view of a display plate and a circularly polarized light plate used in this display device.

FIGS. 4 to 6 show a second embodiment mode of the present invention. FIG. 4 is a front view of a display device for a vehicle having the electric field light emitting display element 1. FIG. 5 is its cross-sectional view (section B-B in FIG. 4). FIG. 6 is a partial sectional view of the display plate and the circularly polarized light plate. Portions equal or corresponding to those of the above first embodiment mode are designated by the same reference numerals and their detailed explanations are omitted.

The display device in this embodiment mode has a speed meter 20 and a tachometer 21. An explanation of the tachometer 21 is omitted. The speed meter 20 has an electric field light emitting display element 1, a display plate 23 arranged on the front face side of the electric field light emitting display element 1 and having a display portion 22 of a scale, a number, a character, etc. showing a speed of the vehicle, and a pointer 24 for indicating the display portion 22. The speed meter 20 also has an indicator main body 25 for rotating the pointer 24, a circularly polarized light plate 3 arranged on the front face side of the display plate 23, and a hard circuit substrate 5. The circuit substrate 5 is electrically connected to the indicator main body 25 and the electric field light emitting display element 1. A driving circuit, etc. for operating the indicator main body 25 and the electric field light emitting display element 1 are mounted to the circuit substrate 5. The speed meter 20 also has light emitting diodes 26 and 26A as a light source for illuminating the pointer 24 and the display plate 23.

Further, the display device has a case member 4 arranged between the display plate 23 and the circuit substrate 5, a cover 6 for covering the rear face side of the circuit substrate 5, and a looking-back member 8. The looking-back member 8 is arranged on a circumferential edge forward side of the circularly polarized light plate 3, and has an opening portion 7 determining a visible area of the circularly polarized light plate 3 (display plate 23) and is constructed with e.g., black synthetic resin. The display device also has a seeing-through plate 9 for covering the forward side of the circularly polarized light plate 3 and constructed with colorless transparent synthetic resin. The basic structure of the electric field light emitting display element 1 and the circularly polarized light plate 3 is the same as the above first embodiment mode, and its explanation is therefore omitted. Further, in FIG. 4, no display portion 22 is visualized unless a light emitting diode 26A for illuminating the display plate is turned on although its details will be described later.

The pointer 24 has an indicating portion 27 constructed with e.g., colorless transparent synthetic resin. An unillustrated white foil is hot-stamped on a rear face of the indicating portion 27. For example, when the light emitting diode 26 for illuminating the pointer and emitting light in red is turned on, the red light is reflected on the white foil and the indicating portion 27 is visualized in red color.

The case member 4 is constructed with white synthetic resin having a light interrupting property, and has an outer circumferential wall 28, a placing portion 29 for placing the display plate 23, a sleeve portion 30 for surrounding the light emitting diode 26 for illuminating a pointer, a holder 10, etc. The electric field light emitting display element 1 is held in the holder 10.

The display plate 23 has a first display area S1 for arranging the display portion 22 of a transmitting property and a ground portion 32 of an untransmitting property in a substrate 31 of a light transmitting property, and a second display area S2 formed by arranging no display portion 22 and no ground portion 32. Similar to the above first embodiment mode, the material of the substrate 31 is constructed by e.g., colorless transparent acrylic resin, polycarbonate resin, etc. formed by a material having an approximately isotropic refractive index, but may be also colored. A light interrupting layer 19 of a dark color system (black color, thick gray, thick blue, thick green, etc.) is arranged on a rear face side of the substrate 31 except for a portion forming the display portion 22. The ground portion 32 is formed by arranging this light interrupting layer 19, and a portion where no light interrupting layer 19 is arranged is the display portion 22 of a transmitting property.

Further, the light interrupting layer 19 is arranged in a portion except for an area corresponding to the electric field light emitting display element 1. The area corresponding to this electric field light emitting display element 1 becomes a second display area S2, and is narrower than the range of a rear face electrode 15 formed in the electric field light emitting display element 1. In FIG. 4, the interior of a rectangular broken line is the second display area S2. Namely, the second display area S2 in the present invention is the area corresponding to the electric field light emitting display element 1, and an area except for this corresponding area becomes a first display area S1. Accordingly, when an annunciating display portion—a display portion for displaying an operating state or warning (e.g., a turn display portion and an engine oil display portion) of a vehicle is arranged within the speed meter 20, and there is a transparent portion of a narrow range for arranging no light interrupting layer 19 around the annunciating display portion, it is called the first display area S1 by including these portions.

Further, a reflecting layer 18 having the same color as the color tone of the rear face electrode 15 of the electric field light emitting display element 1 or a color approximate to this color is arranged between the substrate 31 and the light interrupting layer 19 (ground portion 32). The light interrupting layer 19 and the reflecting layer 18 may be also arranged on the front face side of the substrate 31. In this case, the reflecting layer 18 is arranged closer to the circularly polarized light plate 3 side than the light interrupting layer 19. The reflecting layer 18 may be arranged on the front face side of the substrate 31, and the light interrupting layer 19 may be also arranged on the rear face side of the substrate 31. Further, it is sufficient for the display portion 22 to have a light transmitting property. Accordingly, a coloring layer of a light transmitting property may be also arranged in a portion corresponding to the display portion 22. Otherwise, if the reflecting layer 18 has a light transmitting property, this reflecting layer 18 may be also arranged.

In the display device constructed in this way, only the pointer 24 is visualized within the opening portion 7 of the looking-back member 8, and the circularly polarized light plate 3 is arranged on the front face side of the display plate 23 except for this pointer 24. Therefore, the entire face is uniformly visualized so as to be blackish. For example, when the light emitting diode 26A for illuminating the display plate and emitting light in white color is turned on, the display portion 22 is uniformly transmission-illuminated on the blackish face. Further, when a voltage is applied to the electric field light emitting display element 1, the organic layer 14 emits light and the unillustrated display portion is uniformly transmission-displayed on the blackish face.

Further, even when the speed meter 20 is seen from a slanting direction, the entire face is visualized in a uniform color tone since the reflecting layer 18 arranged on the rear face side of the substrate 31 has the same color as the color tone of the rear face electrode 15 of the electric field light emitting display element 1 or a color approximate to this color. No reflecting layer 18 may be also arranged if a bad influence is exerted on visibility.

Thus, similar to the above first embodiment mode, a display device having an oneness appearance can be obtained irrespective of a display time and a non-display time of the display portion 22 or the electric field light emitting display element 1.

Figure 7:
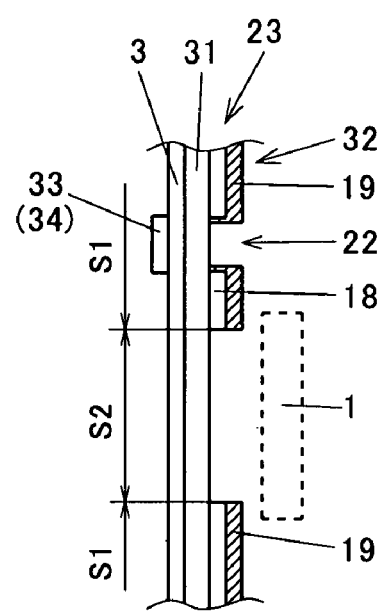
FIG. 7 is a partial sectional view of a display plate and a circularly polarized light plate showing a third embodiment mode of the present invention.

FIG. 7 is a partial sectional view of a display plate and a circularly polarized light plate showing a third embodiment mode of the present invention. In this embodiment mode, a visible display portion is merely arranged on the front face side of the circularly polarized light plate in the above second embodiment mode. Therefore, an explanation will be made by using reference numerals of each figure in the above second embodiment mode except for FIG. 7.

In a front face side portion of the circularly polarized light plate 3 corresponding to the display portion 22 of the display plate 23, for example, a visible display portion 34 is formed by arranging a white transmitting layer 33. This transmitting layer 33 is set to be slightly larger (wider) than the display portion 22 arranged in the display plate 23, but may be also set to be smaller (narrower in width) than the display portion 22.

In the display device constructed in this way, the pointer 24 and the visible display portion 34 are visualized within the opening portion 7 of the looking-back member 8, and the circularly polarized light plate 3 is arranged on the front face side of the display plate 23 except for the pointer 24 and the visible display portion 34. Therefore, the entire face is uniformly visualized so as to be blackish. When the light emitting diode 26A for illuminating the display plate and emitting light in e.g., white color is turned on at a dark time of the circumference such as night time, etc., the visible display portion 34 is uniformly transmission-illuminated on the blackish face. Namely, the visible display portion 34 is always visualized. Effects similar to those of each of the above embodiment modes are obtained by setting such a construction.

For example, the visible display portion 34 may be set to be untransmissive by arranging a white untransmitting layer although this visible display portion 34 is not shown in the drawings. In this case, a light source for illuminating the visible display portion 34 is arranged on the forward side of the circularly polarized light plate 3 instead of the light emitting diode 26A for illuminating the display plate. Further, when the visible display portion 34 is set to be untransmissive, no display portion 22 may be also arranged in the display plate 23.

Figure 8:
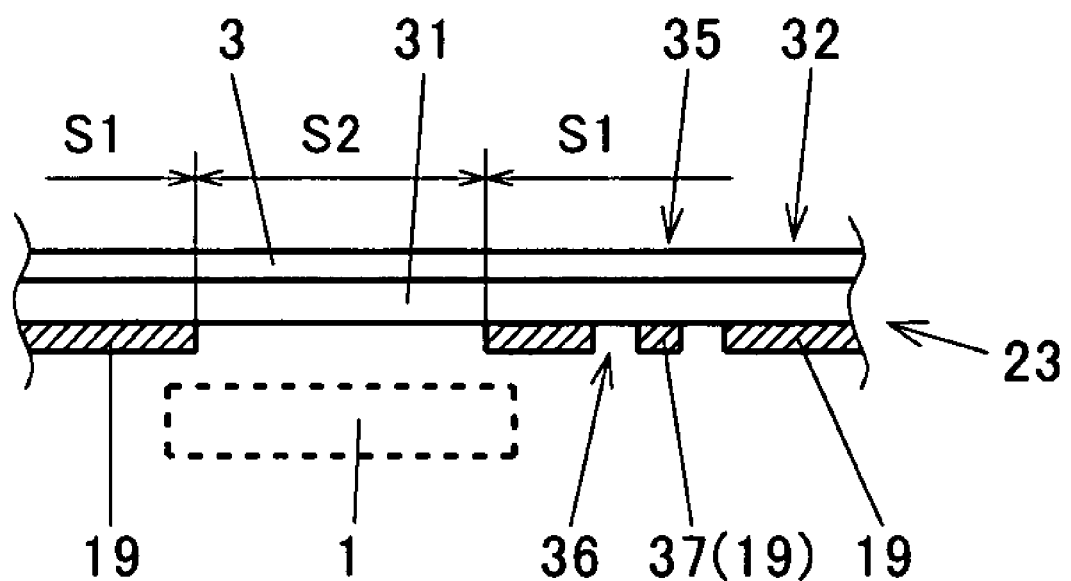
FIG. 8 is a partial sectional view of a display plate and a circularly polarized light plate showing a fourth embodiment mode of the present invention.

FIG. 8 is a partial sectional view of a display plate and a circularly polarized light plate showing a fourth embodiment mode of the present invention. A display device having an electric field light emitting display element 1 in this embodiment mode has no pointer described in the above second embodiment mode although this construction is not shown in FIG. 8. Accordingly, no display portion of a scale, a number, a character, etc. indicated by the pointer is formed in the display plate, and an annunciating display portion as the display portion is arranged in this embodiment mode.

The display plate 23 has a first display area S1 for arranging an annunciating display portion 35 and a ground portion 32 of an untransmitting property in a substrate 31 of a light transmitting property, and a second display area S2 formed by arranging no annunciating display portion 35 and no ground portion 32. The annunciating display portion 35 is a display portion (e.g., a turn display portion and an engine oil display portion) for displaying an operating state or abnormal contents, etc. of a vehicle. For example, a mark 37 of a turn and engine oil is formed by a black light interrupting layer 19, and a transmitting portion 36 is arranged around the mark 37 (light interrupting layer 19). Further, the ground portion 32 is formed by arranging the black light interrupting layer 19 in the circumference of the annunciating display portion 35. Otherwise, the mark 37 may be also formed by a coloring layer of a transmitting property without arranging the transmitting portion 36. Further, a character display portion for the annunciating display portion 35 may be also added. Thus, the first display area S1 is formed.

The second display area S2 is an area corresponding to the electric field light emitting display element 1, and the annunciating display portion 35 and the ground portion 32 (light interrupting layer 19) are not arranged in this area. In the display device constructed in this way, the entire face uniformly becomes a blackish face unless the electric field light emitting display element 1 or the annunciating display portion 35 is displayed. The transmitting portion 36 of the annunciating display portion 35 is transmission-illuminated by turning-on a light source arranged in the back of the display plate 23 corresponding to each annunciating display portion 35. Further, the electric field light emitting display element 1 is also transmission-displayed similarly to each of the above embodiment modes.

In this embodiment mode, similar to each of the above embodiment modes, a display device having an oneness appearance is obtained. In this embodiment mode, no reflecting layer 18 having the same color as the color tone of the rear face electrode 15 of the electric field light emitting display element 1 or a color approximate to this color is arranged on the rear face side of the substrate 31. However, this reflecting layer 18 may be also arranged. The entire face is also visualized in a uniform color tone by arranging the reflecting layer 18 even when it is seen from a slanting direction as mentioned above. Thus, the display device having a more oneness appearance is attained.

INDUSTRIAL APPLICABILITY

The present invention is applied to the display device in which the circularly polarized light plate is arranged on the front face side of the light emitting display element such as the electric field light emitting display element.

The invention claimed is:
1. A display device comprising:
a light emitting display element;
a translucent member arranged over a front surface side of the light emitting display element;
a circularly polarized light plate arranged over a front surface side of the translucent member; and
a light interrupting layer arranged over a rear surface side of the circularly polarized light plate, and covering said light emitting display element, except a display area of the light emitting display element,
wherein said translucent member is constructed of a material having an approximately isotropic refractive index, and
wherein said light emitting display element consists of an electric field light emitting display element having a translucent substrate, a transparent electrode, a light emitting layer and a rear face electrode; and
a reflecting layer having the same color tone as a color tone of said rear face electrode is arranged between said circularly polarized light plate and said light interrupting layer.

2. A display device comprising: a light emitting display element;
and a display plate, a substrate and a circularly polarized light plate are respectively positioned in overlying sequence in front of the light emitting display element, wherein:
the display plate has a first portion comprising a reflecting layer having a rear side over which a light interrupting layer is arranged, and a second portion where the reflecting layer and the light interrupting layer are not present,
the light emitting display element is positioned to be aligned in front of the second portion,
the substrate is constructed of a material having and approximately isotropic refractive index and configured to transmit light and
the reflecting layer having the same color as a color tone of said rear face electrode or a color approximate to this color.

3. The display device according to claim 2, wherein said light emitting display element consists of an electric field light emitting display element having a translucent substrate, a transparent electrode, a light emitting layer and a rear face electrode.

4. The display device according to claim 2 or 3, wherein a visible display portion is arranged in a front face side portion of said circularly polarized light plate corresponding to said display portion.

* * * * *